United States Patent [19]

Needs et al.

[11] Patent Number: 4,565,756
[45] Date of Patent: Jan. 21, 1986

[54] COLOR IMAGING DEVICE

[75] Inventors: Howard C. Needs; Lodewijk Blok, both of Eindhoven, Netherlands

[73] Assignee: U.S. Philips Corporation, New York, N.Y.

[21] Appl. No.: 660,256

[22] Filed: Oct. 12, 1984

Related U.S. Application Data

[62] Division of Ser. No. 434,666, Oct. 15, 1982, abandoned.

[30] Foreign Application Priority Data

Nov. 10, 1981 [NL] Netherlands .......................... 8105071

[51] Int. Cl.⁴ ............................ G03F 9/00; G03C 5/00
[52] U.S. Cl. ........................................ 430/7; 430/321; 430/322; 430/394; 357/24
[58] Field of Search ...................... 430/7, 321, 27, 293, 430/394, 322; 357/24 LR; 250/578

[56] References Cited

U.S. PATENT DOCUMENTS

| | | | |
|---|---|---|---|
| 3,978,512 | 8/1976 | Hoeberechts | 357/31 |
| 4,001,878 | 1/1977 | Weimer | 357/24 LR X |
| 4,081,277 | 3/1978 | Brault et al. | |
| 4,315,978 | 2/1982 | Hartman | 357/30 X |
| 4,345,021 | 8/1982 | Ogawa et al. | 430/321 |
| 4,412,236 | 10/1983 | Sasano et al. | 357/24 LR X |
| 4,419,425 | 12/1983 | Ogawa et al. | 430/7 |

FOREIGN PATENT DOCUMENTS

| | | | |
|---|---|---|---|
| 0002675 | 1/1981 | Japan | 357/24 LR |
| 57-4012 | 1/1982 | Japan | 430/7 |

Primary Examiner—John E. Kittle
Assistant Examiner—José G. Dees
Attorney, Agent, or Firm—Marc D. Schechter

[57] ABSTRACT

A color filter having filter elements respectively passing light of the colors red, green and blue is provided on a semiconductor image sensor which comprises a system of photosensitive elements. The filter elements are separated by grooves which eliminate the running of dye liquid during dyeing the various systems of filter elements and which hence eliminate color defects. Instead of grooves, the filter elements may also be separated by regions which have been converted into a structure which is substantially impervious to liquid. The color filters may also be used in a vidicon-type camera tube for imaging color pictures.

10 Claims, 10 Drawing Figures ent pattern of apertures is formed in the barrier layer by means of a photolithographic process. The pattern of apertures corresponds to a system of filter elements of one color to be formed. A dye is then provided in the apertures in the barrier layer, and the regions of the transparent layer underlying the apertures are dyed. After dyeing, the barrier layer is removed. In this manner a first system of filter elements passing, for example red light, is formed. The process is repeated for the formation of the systems of green and blue light-passing filter elements. The color filter may be formed as a stripe filter or as a mosaic filter.

COLOR IMAGING DEVICE

This is a division, of application Ser. No. 434,666, filed Oct. 15, 1982, abandoned.

BACKGROUND OF THE INVENTION

The invention relates to a color imaging device comprising an imaging device and a color filter. The color filter has one layer in which at least two systems of filter elements, each passing different colors of light, are formed. The filter elements are formed by coloring with dyes. The invention also relates to a method of manufacturing such a device.

Such a color imaging device is known from U.S. Pat. No. 4,081,277 and is used for recording video images. In this patent, the imaging device is a semiconductor layer which has a system of photosensitive elements. A color filter is provided directly on the system of photosensitive elements. The color filter is one layer having systems of filter elements passing light of various colors, for example red, green and blue. In order to obtain the correct video signal, each filter element of the color filter should be in registration with a photosensitive element of the semiconductor layer.

In manufacturing these filters, a transparent layer is provided on the semiconductor layer, and a barrier layer is then provided on the transparent layer. A pattern of apertures is formed in the barrier layer by means of a photolithographic process. The pattern of apertures corresponds to a system of filter elements of one color to be formed. A dye is then provided in the apertures in the barrier layer, and the regions of the transparent layer underlying the apertures are dyed. After dyeing, the barrier layer is removed. In this manner a first system of filter elements passing, for example red light, is formed. The process is repeated for the formation of the systems of green and blue light-passing filter elements. The color filter may be formed as a stripe filter or as a mosaic filter.

Unfortunately, the manufacture of color filters in the above-described manner gives rise to color defects and errors in the registration of the filter elements with respect to the photosensitive elements. When the transparent layer is dyed via the apertures in the barrier layer, only the regions directly underlying the apertures should be colored. By diffusion in the direction parallel to the layer, however, dye easily travels outside the regions to be colored. As a result of this, regions are formed along the edges of the filter elements in which the colors of the filter elements belonging to different systems run. In addition to the requirement that the transparent layer should have a very small diffusion in the direction parallel to the layer, the layer should of course easily absorb dye. As a result of these two competing requirements the number of suitable materials for the transparent layer is very much restricted.

Furthermore, in order to obtain sharp edges of the apertures in the barrier layer, a barrier layer is required having a large resolving power with respect to the photolithographic process. In addition, three very accurate photolithographic steps are required since the systems of filter elements passing light in different colors must very accurately adjoin each other and the positions of the filter elements of each system should accurately correspond to the associated photosensitive elements.

SUMMARY OF THE INVENTION

It is therefore an object of the invention to provide a color imaging device having a color filter in which color defects are largely absent.

It is a further object of the invention to provide a color imaging device which can be manufactured in a simple manner and in which the filter elements of the color filter are accurately in registration with the photosensitive elements of the imaging device.

A color imaging device according to the present invention is characterized in that the filter elements are separated from each other by separation regions provided in the layer.

By providing separation regions between the filter elements, dye for one system of filter elements is prevented from entering the region of another system of filter elements by diffusion in a direction parallel to the layer. As a result of this, color defects in the color filter are reduced.

Since there are substantially no restrictions anymore with respect to the diffusion in a direction parallel to the layer a greater choice of materials for the layer to be dyed is available. With a color filter according to the invention a greater accuracy is achieved in the registration of the filter elements and the photosensitive elements because, instead of three accurate photolithographic process steps, only one accurate photolithographic process step is required, namely only that for providing the separation regions. Since a smaller number of accurate photolithographic process steps is required, the color filters can also be manufactured in a simpler manner.

In a suitable embodiment of a color filter according to the invention, the separation regions are formed by grooves provided in the layer. As a result of this, separate filter elements are present which make diffusion of dyes from one filter element to the other filter element impossible.

In another embodiment of the invention, the separation regions are formed by regions which have been converted into a structure which is substantially impervious to liquid. The structure of the layer which easily absorbs dye can be converted physically or chemically into a structure which is substantially impervious to liquid. This impervious structure again prevents dye from diffusing from one filter element to other filter elements.

The filter elements can be separated in the above-described manners by separation regions which are very narrow as compared with the dimensions of the filter elements. In special cases in which a very high quality filter is required, the light falling through the separation region may have a disturbing effect. In that case it is necessary to make the zones at the area of the separation regions impervious to light. For the purpose, in a further embodiment of the invention, a light-impervious layer is provided at the area of the separation regions. The light-impervious layer may be, for example, a vapor-deposited metal layer.

A suitable embodiment of a color imaging device according to the invention is characterized in that the imaging device is a semiconductor layer having a system of photosensitive elements. The imaging device is a semiconductor sensor which, dependent on the construction of the sensor, comprises a stripe filter or a mosaic filter. A stripe filter is used, for example, in a sensor provided with CCD's (Charge-Coupled Devices) which is constructed as a so-called frame-transfer sensor; a mosaic filter is used in, for example, an x-y sensor having integrated photodiodes.

In a preferred embodiment of the invention, the color filter is provided directly on the semiconductor layer. As a result of this it is possible in a simple manner to provide color filters having filter elements which are accurately in registration with the photosensitive elements of the semiconductor layer. According to another embodiment, however, it is also possible to provide the color filters on a transparent substrate, and to then connect the substrate to the semiconductor layer. An extra step is necessary for positioning the filter elements of the color filter with respect to the photosensitive elements in the semiconductor layer.

The invention is particularly suitable for, but not restricted to, imaging devices in the form of a semiconductor layer having photosensitive elements. For example according to another enbodiment of the invention, the imaging device may be a vidicon-type camera tube comprising a window which has a photosensitive layer on its inside surface. The color filter is provided between the photosensitive layer and the window. In this embodiment the color filter may be provided directly on the window of the tube, or it may be provided first on a substrate which is connected to the window of the tube.

A method of manufacturing an imaging device according to the invention comprises the following steps:
(a) providing a transparent layer on a substrate,
(b) providing, by means of a photolithographic process, a pattern of separation regions in the transparent layer to form filter elements in the layer,
(c) providing a barrier layer over the transparent layer,
(d) providing, by means of a photolithographic process, a pattern of apertures in the barrier layer, which pattern corresponds to a first system of filter elements,
(e) providing, via the apertures in the barrier layer, a dye on the filter elements of the first system, and
(f) removing the barrier layer.

The steps of (c) to (f) of the method should be repeated for the formation of further systems of filter elements for passing light of different colors.

The method according to the invention has the advantage that an accurate photolithographic process step is necessary only to provide the pattern of separation regions in the transparent layer. As a result of the formation of separate filter elements, diffusion in a direction parallel to the layer need no longer be small. This provides a greater choice of materials for the transparent layer to be dyed. The sizes of the filter elements are entirely fixed due to the provision of the separation regions, and the sizes are no longer determined by the sizes of the apertures in the barrier layer. The sizes of the apertures in the barrier layer may therefore be chosen to be smaller than the sizes of the filter elements. Hence, the apertures need no longer be provided via an accurate photolithographic process. In addition, the barrier layer need no longer have a large resolving power.

BRIEF DESCRIPTION OF THE DRAWING

FIG. 1b is a plan view of the imaging device shown in FIG. 1a.

FIGS. 2a, 2b, 2c, and 2d are schematic, cross-sectional views of the various steps in the manufacture of the color imaging device shown in FIG. 1a.

FIG. 5b is a cross-sectional view taken on line Vb—Vb of FIG. 5a.

DESCRIPTION OF THE PREFERRED EMBODIMENTS

Figure 1A:
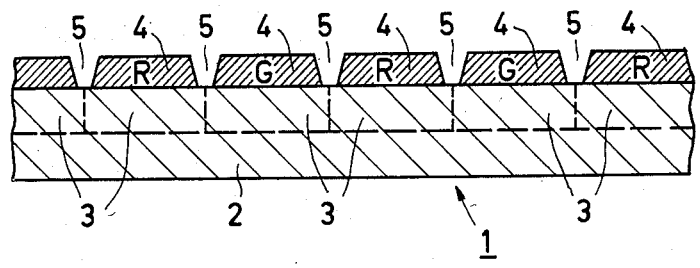
FIG. 1a is a schematic, cross-sectional view of a part of a first embodiment of a color imaging device according to the invention.

FIG. 1a shows a part of a color imaging device which is constructed as a so-called x-y sensor. The device 1 comprises a layer of semiconductor material 2, in which a large number of photodiodes 3 are formed arranged in rows and columns. A color filter is provided on the system of photodiodes. The color filter is formed by systems of filter elements 4 passing light of the colors red (R), green (G) and blue (B).

Figure 1B:
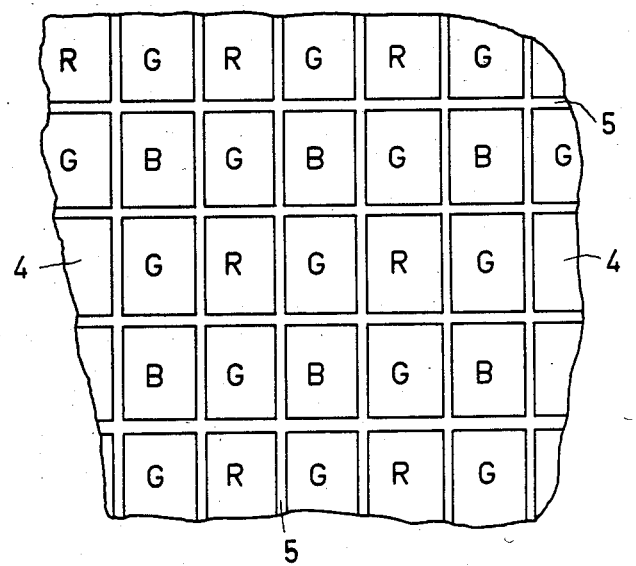

The various systems of filter elements 4 form a so-called mosaic filter as is shown in FIG. 1b, which is a plan view of FIG. 1a. Each of the filter elements 4 is accurately in registration with an associated photodiodes 3 in the semiconductor layer 2. The filter elements 4 are separated from each other by grooves 5 extending above the edges of the photodiodes 3.

The semiconductor layer 2 comprises, for example, 500×300 photodiodes 3 having an area of approximately 300 $\mu m^2$ on which the filter elements 4 are provided. Filter elements 4 are separated by grooves 5 having a width, for example, approximately 1 to 5 $\mu m$.

Briefly, the operation of the imaging device is as follows. The scene to be picked up is displayed on the system of photodiodes 3. As a result of this, charge is generated in the photodiodes 3. Each photodiode 3 is connected to a matrix of x and y conductors by means of a field effect transistor also formed in the semiconductor layer 2 but not shown in the Figure. The charge image is now read by driving the x and y conductors in the correct sequence.

Figure 2A:
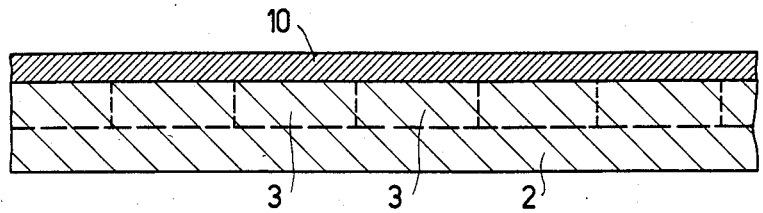

The manufacture of the color filter on the photosensitive elements 3 of the semiconductor layer 2 will be explained in detail with reference to FIGS. 2a and 2d. First, a transparent layer 10 is provided on the semiconductor layer 2 in a thickness of approximately 0.5–3 $\mu m$ (FIG. 2a). The layer 10 is preferably also a photoresist. If the layer 10 itself is not a photoresist, a photoresist layer is provided on the transparent layer. The transparent layer is then exposed through a photomask which is provided with the pattern of grooves to be provided. The photomask must be accurately positioned with respect to the photosensitive elements 3 in the semiconductor layer 2.

Figure 2B:
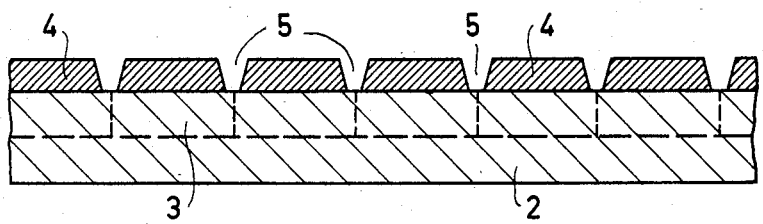
Figure 2C:
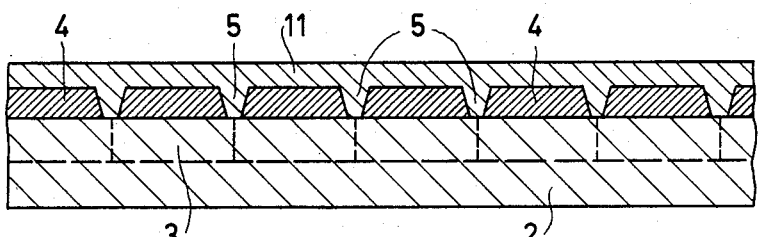

After developing the exposed photoresist, the filter elements 4, separated by grooves 5, are obtained as shown in FIG. 2b. By providing the grooves 5, the positions of all filter elements 4 are fixed with respect to the photosensitive elements 3. Next, an approximately 0.5–2 $\mu m$ thick barrier layer 11, preferably a photoresist layer, is provided (FIG. 2c). This layer 11 is then exposed through a mask which has a pattern of apertures.

Figure 2D:
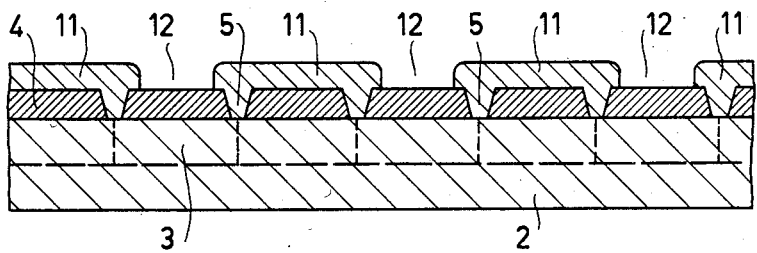

The layer 11 is then developed, and the apertures 12 in the layer are obtained (see FIG. 2d).

The sizes of the apertures 12 are smaller than the sizes of the filter elements 4. As a result of this, great accuracy is not required for providing the apertures 12 in the barrier layer 11. Moreover, the resolving power of the barrier layer 11 need not be large.

The apertures 12, as shown in FIG. 2d, are provided above all filter elements 4 which have to be dyed with, for example, a dye passing red light. The dye is provided via the apertures 12 and dyes the filter elements 4 by diffusion. Due to the grooves 5, red dye cannot enter filter elements 4 other than those which are uncovered.

After dyeing the barrier layer 11 is removed. By reapplying the barrier layer 11 and the subsequent steps, but with apertures at different location and with dyes passing green and blue light, respectively, for the various systems of filter elements 4, a mosaic color filter is obtained as shown in FIG. 1b. The method of manufacturing the color filters will be described in greater detail with reference to the specific examples below.

EXAMPLE I

A transparent photoresist layer is provided in a thickness of 1-2 $\mu$m on a semiconductor layer by means of spin-coating. The photoresist layer is of the polyvinyl cinnamate type, for example, the photoresist commercially available from Kodak under the names KPR and KPL. The layer is dried at a temperature of 90° C. for 10 minutes. The layer is then exposed through a photomask for 35 seconds by means of UV light having a wavelength of between 300 and 400 nm. The unexposed parts of the photoresist layer are removed by developing in toluene for 120 seconds, as a result of which filter elements are obtained which are separated by grooves.

After drying the layer of filter elements at 90° C. for 10 minutes, an approximately 2 $\mu$m thick photoresist layer is provided as a barrier layer. The photoresist layer is a gelatin bichromate photoresist of, for example, the following composition in percent by weight: 2% $(NH_4)_2Cr_2O_7$, 7.5% gelatin and 90.5% water. Instead of a gelatin bichromate photoresist, a fish glue bichromate photoresist may alternatively be used. The layer is dried at 50° C. for 10 minutes. The layer is then exposed to UV light through a photomask for 180 seconds. The unexposed areas are removed by rinsing with water for 180 seconds. As a result, apertures are obtained in the barrier layer above the filter elements which are to be dyed first.

Dyeing of the filter elements is carried out by means of a heat transfer dye which is dispersed in a binder layer of a polymer provided on a substrate. For example, for the blue dye the layer has the following composition in percent by weight: 5% of a dye available from BASF under the trade name Lurafix Blue R-RL, 4% cellulose acetate butyrate obtainable under the name Tenite II, EAB-381-20 from Kodak, 36% ethyl alcohol, 36% ethyl glycol and 1% acetone. For the actual dyeing of the filter elements, the barrier layer and the substrate with binder layer are heated to remove residues of solvents and water. The filter elements and barrier layer are then placed on the binder layer and heated to 210° C. for 3 minutes. At this high temperature the dye may diffuse from the binder layer into the filter elements underlying the apertures in the barrier layer.

After dyeing, the barrier layer is removed in a 50% sodium hydroxide solution at 80° C. After thoroughly rinsing and drying, the process is repeated for dyeing the filter elements passing red and green light. In the binder layer the blue dye Lurafix Blue F-RL should be replaced by Lurafix Red RF for the red light-passing filter elements, and a mixture of Lurafix Blue F-RL and Lurafix Yellow RL for the green light-passing filter elements, respectively.

EXAMPLE II

A transparent photoresist layer is provided on a semiconductor layer again by means of spin-coating. The photoresist layer is a fish glue bichromate photoresist of, for example, the following composition in percent by weight: 3.7% $(NH_4)_2Cr_2O_7$, 37.5% Norland Photogravers Glue obtainable from Norland Products Inc., 6.3% acetone and 53.5% water. Instead of a fish glue bichromate photoresist, a gelatin bichromate photoresist may alternatively be used. The photoresist layer is dried at 50° C. for 10 minutes. The layer is then exposed to UV light through a photomask for 120 seconds. The layer is developed in running water for 2 minutes as a result of which photoelements are obtained which are separated by grooves.

After drying the layer at 90° C. for 10 minutes, an approximately 1 $\mu$m thick photoresist layer is provided as a barrier layer by means of spin coating. This photoresist layer is a positive photoresist of the naphtoquinone diazide type as is obtainable from Shipley Company (USA) under the name Shipley AZ 1350. After exposure through a photomask the layer is developed, for example, with Shipley AZ developer and then dried at 120° C. for 10 minutes. The apertures in the barrier layer are then obtained.

Dyeing the filter elements is carried out by means of aqueous solutions with wood dyes. A suitable solution for dyeing the red light-passing filter elements in percent by weight is composed of 1% Neopolar Brillant Rot B obtainable from Ciba Geigy, 0.6% acetic acid, 0.8% sodium acetate, and 97.6% water. For dyeing the blue light-passing filter elements, the dye solution consists of 1% Sandolan-Wolkblau N-FRL obtainable from Sandoz, 0.6% acetic acid, 0.8% sodium acetate and 97.6% water. For the green light-passing filter elements, the dye solution consists of 0.3% Solophenyl Turkisch Blau BRL obtainable from Ciba Geigy, 0.4% Erionyl grun 46 also from Ciba Geigy, 0.3% Sandolan Echt Gelb PL 40 obtainable from Sandoz, 0.6% acetic acid, 0.8% sodium acetate and 97.6% water. The dyes are supplied to the filter elements at 80° C. for 5 minutes. After dyeing the positive photoresist is removed by rinsing with acetone.

A further embodiment of the invention will be described in greater detail with reference to FIG. 3 in which the same reference numerals are used for the same components as in FIG. 1a. At the area of the grooves 5, a 0.1-1 $\mu$m thick metal layer 15 of, for example, nickel is vapor-deposited on the layer of photodiodes 3. This is to eliminate the disturbing effect of the light which is incident on the photodiodes 3 through the narrow grooves 5.

Figure 3:
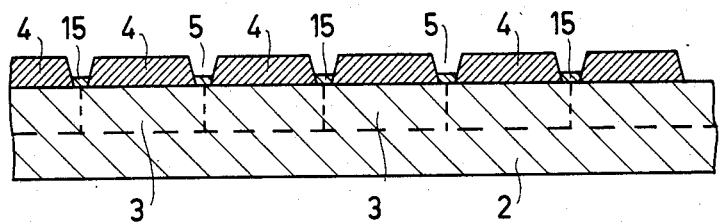
FIG. 3 is a schematic, cross-sectional view of a part of a further embodiment of the color imaging device according to the invention.

In the devices shown in FIGS. 1, 2 and 3, the color filter is provided directly on the layer with photosensitive elements. This has the advantage that by accurately providing the pattern of grooves the positions of the filter elements are accurately fixed with respect to the photosensitive elements. The color filter, however, may also be provided on a transparent substrate which, after aligning the filter elements and the photosensitive elements, is connected to the semiconductor layer.

Figure 4:
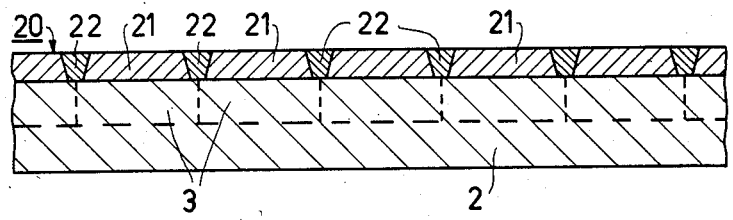
FIG. 4 is a schematic, cross-sectional view of a part of a second embodiment of a color imaging device according to the invention.

A method of manufacturing a second embodiment of a color filter according to the invention will be described in greater detail with reference to FIG. 4. A transparent photoresist layer 20, having a thickness of approximately 0.5-3 μm, is provided on the photodiodes 3 of the semiconductor layer 2 by means of spin coating. The layer 20 is a negative photoresist, i.e. a photoresist which becomes insoluble by exposure, and is further of the polymeric type.

The transparent layer 20 is exposed, for example, to UV light through a photomask which has the pattern of separation regions and which is accurately positioned with respect to the photodiodes 3. As a result of the exposure, the exposed separation regions 22 obtain a structure different from the unexposed regions of the filter elements 21. In fact, as a result of the exposure, cross-links are formed between the polymer chains of the layer 20, and the polymer becomes insoluble. Due to the formed cross-links the density of the polymer increases considerably so that the layer 20 at the area of the exposed separation regions 22 becomes substantially impervious to liquid.

The dyeing of the systems of filter elements 21 is carried out in the same manner as described with reference to FIGS. 2c and 2d, but the removal of the barrier layer may be followed by an exposure to UV light so as to make the material of the filter elements 21 insoluble.

It is also possible to use a transparent layer to be dyed in which separation regions are formed between the filter elements by chemically converting the layer at the area of the separation region into a structure which is substantially impervious to liquid.

In the above-described embodiments, the imaging device is formed by an x-y sensor having photodiodes which comprises a mosaic filter. However, the invention may also be used in other types of sensors which, dependent on their structure, have to be provided with a mosaic filter or a stripe filter. For example, the invention may be used in a sensor having CCD's (Charge-Coupled Devices) which is constructed as a so-called frame-transfer sensor, and which is to be provided with a stripe filter, or in a CID-sensor (Charge Injection Device) which may be provided with a mosaic filter.

A third embodiment of a color imaging device according to the invention will be described in greater detail with reference to FIG. 5a which is a schematic, sectional view of a vidicon-type camera tube. The tube is formed by a glass envelope 31 having a window portion 32. On the inside of the window portion 32, a color filter 39 is provided. The color filter 39 is a so-called stripe filter which is formed by stripe-shaped filter elements 39R, 39G and 39B passing, respectively, light of the colors red, green and blue. The filter elements are in turn separated by grooves which prevent the running of the dyes during dyeing and hence prevent color defects. Instead of grooves the filter elements may alternatively be separated from each other by separation regions having a structure which is substantially impervious to the dye.

A very thin layer 40 of glass is provided over the stripe filter 39. On the glass layer 40, three transparent interdigitated signal electrodes 43R, 43G and 43B are provided. The filter elements 39 are accurately in registration with the interdigitated signal electrodes 43. FIG. 5b shows the configuration of these three interdigitated electrodes 43R, 43G and 43B. A photoconductive layer 44 is provided over the signal electrodes 43.

The tube further comprises electrode means 35 having a cathode 36 for generating and focusing an electron beam directed on the layer 44. The tube is surrounded by a system of coils 37 for deflecting the electron beam over the photosensitive layer 44 according to a raster of substantially parallel lines. The scene to be picked up is projected on the photoconductive layer 44 through the color filter 39. As a result of this, a charge image is formed on the free surface of the layer 44 under the influence of the potentials applied to the signal electrodes 43. This charge image is reduced by the scanning electron beam, the video signal for each of the three colors being derived from the signal electrodes 43R, 43G and 43B via a resistor.

Figure 5A:
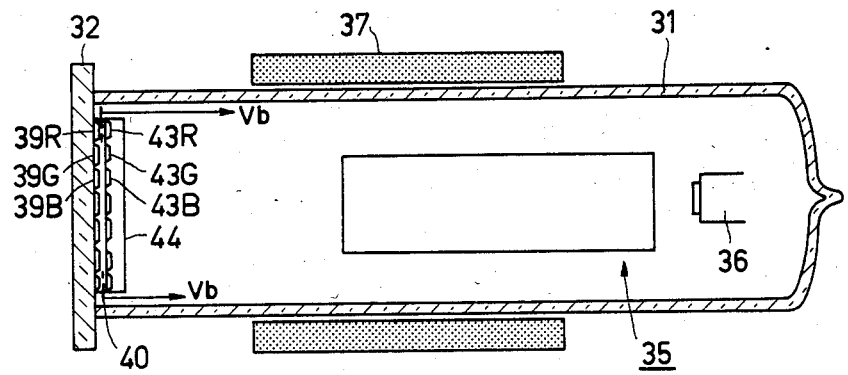
FIG. 5a is a schematic, cross-sectional view of a third embodiment of a color imaging device according to the invention.
Figure 5B:
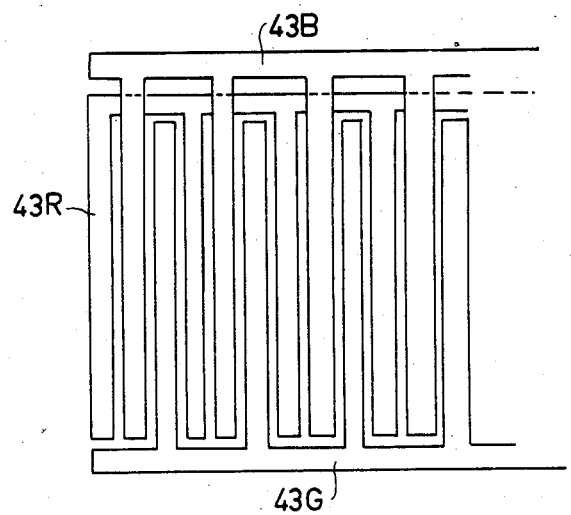

In the enbodiment shown in FIG. 5a, the color filter is provided directly on the window portion of the tube. However, it is alternatively possible to provide the color filter on a glass plate and to secure the glass plate to the tube.

The invention has been explained with reference to embodiments in which the color filter is constructed as a stripe filter or as a mosaic filter having filter elements passing light of the colors red, green and blue. However, the invention is not restricted to color filters having filter elements passing primary colors of light. The color filters may alternatively be constructed with filter elements passing light of the complementary colors cyan, magenta and yellow or with combinations of filter elements passing light of primary and complementary colors. For example, color filters may be provided with filter elements passing light of the clors red, green and cyan, with filter elements passing light of the colors white, green, yellow and cyan, or with filter elements passing light of the colors white, yellow and cyan.

We claim:

1. A method of manufacturing a color imaging device comprising the steps of:
   providing an imaging device substrate;
   providing a transparent layer on the substrate;
   providing, by a photolithographic process, a pattern of filter elements separated by separation regions in the transparent layer;
   providing a barrier layer over the transparent layer;
   providing, by a photolithographic process, a pattern of apertures in the barrier layer, the pattern of apertures corresponding to the locations of a first system of filter elements for passing light of a first color;
   providing a dye, through the apertures in the barrier layer, to dye the filter elements of the first system; and
   removing the barrier layer.

2. A method as claimed in claim 1, characterized in that the method further comprises the steps of:
   providing a barrier layer over the transparent layer;
   providing, by a photolithographic process, a pattern of apertures in the barrier layer, the pattern of apertures corresponding to the locations of a second system of filter elements for passing light of a second color, the second color being different from the first color;
   providing a dye, through the apertures in the barrier layer, to dye the filter elements of the second system; and
   removing the barrier layer.

3. A method of manufacturing a color imaging device comprising the steps of:
   providing an imaging device substrate;

providing a transparent layer on the substrate;
providing a pattern of separation regions in the transparent layer, said separation regions defining a pattern of separate filter elements, said separation regions being formed by causing portions of the transparent layer to become insoluble;
providing a barrier layer over the transparent layer;
providing, by a photolithographic process, a pattern of apertures in the barrier layer, the pattern of apertures corresponding to the locations of a first system of filter elements for passing light of a first color;
providing a dye, through the apertures in the barrier layer, to dye the filter elements of the first system; and
removing the barrier layer.

4. A method as claimed in claim 3, characterized in that the method further comprises the steps of:
providing a barrier layer over the transparent layer;
providing, by a photolithographic process, a pattern of apertures in the barrier layer, the pattern of apertures corresponding to the locations of a second system of filter elements for passing light of a second color, the second color being different from the first color;
providing a dye, through the apertures in the barrier layer, to dye the filter elements of the second system; and
removing the barrier layer.

5. A method as claimed in claim 4, characterized in that the separation regions are formed by exposing portions of the transparent layer to light.

6. A method as claimed in claim 4, characterized in that the separation regions are formed by chemically treating portions of the transparent layer.

7. A method of manufacturing a color imaging device comprising the steps of:
providing an imaging device substrate;
providing a transparent layer on the substrate;
providing a pattern of separation regions in the transparent layer, said separation regions defining a pattern of separate filter elements, said separation regions being formed by causing portions of the transparent layer to become impervious to liquid;
providing a barrier layer over the transparent layer;
providing, by a photolithographic process, a pattern of apertures in the barrier layer, the pattern of apertures corresponding to the locations of a first system of filter elements for passing light of a first color;
providing a dye, through the apertures in the barrier layer, to dye the filter elements of the first system; and
removing the barrier layer.

8. A method as claimed in claim 7, characterized in that the method further comprises the steps of:
providing a barrier layer over the transparent layer;
providing, by a photolithographic process, a pattern of apertures in the barrier layer, the pattern of apertures corresponding to the locations of a second system of filter elements for passing light of a second color, the second color being different from the first color;
providing a dye, through the apertures in the barrier layer, to dye the filter elements of the second system; and
removing the barrier layer.

9. A method as claimed in claim 8, characterized in that the separation regions are formed by exposing portions of the transparent layer to light.

10. A method as claimed in claim 8, characterized in that the separation regions are formed by chemically treating portions of the transparent layer.

* * * * *